United States Patent [19]

Ueno et al.

[11] Patent Number: 4,599,688

[45] Date of Patent: Jul. 8, 1986

[54] SEMICONDUCTOR MEMORY DEVICE HAVING SWITCHING CIRCUIT FOR PREVENTING CHANNEL LEAKAGE IN CONSTANT CURRENT SOURCE

[75] Inventors: Kouji Ueno; Tamio Miyamura, both of Kawasaki, Japan

[73] Assignee: Fujitsu Limited, Kawasaki, Japan

[21] Appl. No.: 508,544

[22] Filed: Jun. 28, 1983

[30] Foreign Application Priority Data

Jun. 30, 1982 [JP] Japan ................................ 57-111536

[51] Int. Cl.[4] ............... G11C 17/00; G11C 7/00
[52] U.S. Cl. ...................................... 365/189; 365/104
[58] Field of Search ............... 365/189, 174, 104, 105, 365/103, 94

[56] References Cited

U.S. PATENT DOCUMENTS

| | | | |
|---|---|---|---|
| 4,319,341 | 3/1982 | Fukushima et al. | 365/96 |
| 4,347,584 | 8/1982 | Fukushima et al. | 365/104 |
| 4,347,586 | 8/1982 | Natsui | 365/174 |
| 4,376,984 | 3/1983 | Fukushima et al. | 365/104 |
| 4,424,582 | 1/1984 | Fukushima et al. | 365/189 |
| 4,488,261 | 12/1984 | Ueno et al. | 365/104 |

*Primary Examiner*—James W. Moffitt
*Assistant Examiner*—Glenn A. Gossage
*Attorney, Agent, or Firm*—Staas & Halsey

[57] ABSTRACT

A semiconductor memory device includes control circuits which are at least a switching circuit and program circuits provided with a constant current source. The switching circuit is mainly comprised of an input side transistor and an output side transistor in the form of a thyristor, and both transistors are on only when a write operation is conducted by the program circuits and the constant current source. If no write operation is conducted, these transistors are both off.

11 Claims, 7 Drawing Figures

SEMICONDUCTOR MEMORY DEVICE HAVING SWITCHING CIRCUIT FOR PREVENTING CHANNEL LEAKAGE IN CONSTANT CURRENT SOURCE

BACKGROUND OF THE INVENTION

1. Field of the Invention

The present invention relates to a semiconductor memory device, more particularly to control circuits included in a semiconductor memory device which is preferably fabricated as a programmable read only memory (PROM).

2. Description of the Prior Art

Various types of semiconductor memory devices (hereinafter also called simply memories) have been put into practical use. The present invention mainly refers to a PROM. In a usual PROM, a bit selection, word selection, and read operation are achieved under a power source voltage of $V_{cc}$. During a write operation thereof, however, a program control voltage $V_p$ is needed which exceeds the level of $V_{cc}$, for example, 20 V.

A PROM is usually supplied for commercial sale in a standard one-chip package. Therefore, the number of input/output pins is limited. Because of this, a pin may often have to be commonly used as a terminal for two or more different input/output signals. Such common use of a pin poses no problem if the input/output signals have the same voltage levels. However, there is a problem if a pin is commonly used as an input terminal for both a program control voltage $V_p$ and a usual input control signal $S_c$ having a voltage of $V_{sc}$.

In such a case, a switching circuit must be employed so as to prevent malfunctions in the constant current source which drives the program circuits connected to the common use pin. That is, the switching circuit operates to transfer the desired program control voltage $V_p$ to the constant current source and the program circuits selectively, only when the program control voltage $V_p$ is applied to the pin. The present invention specifically relates to such a switching circuit.

There is, however, a problem with the memory in that undesired channel leakage in the transistor comprising the constant current source often occurs, resulting in erroneous operation.

SUMMARY OF THE INVENTION

It is an object of the present invention to provide a semiconductor memory device including therein a switching circuit which can overcome the above-mentioned problem.

The above object is attained by a switching circuit which further operates, while maintaining its inherent function, to prevent application of the power source voltage of $V_{cc}$ to a line between the common use pin and both the constant current source and the program circuits during the read operation of the memory, so that, even if channel leakage occurs in the transistor of the constant current source, the transistor cannot be turned on.

BRIEF DESCRIPTION OF THE DRAWINGS

The present invention will be more apparent from the ensuing description with reference to the accompanying drawings, wherein.

DESCRIPTION OF THE PREFERRED EMBODIMENTS

As previously mentioned, the present invention relates to a switching circuit. Therefore, first the location of a switching circuit in a PROM will be clarified.

Figure 1:
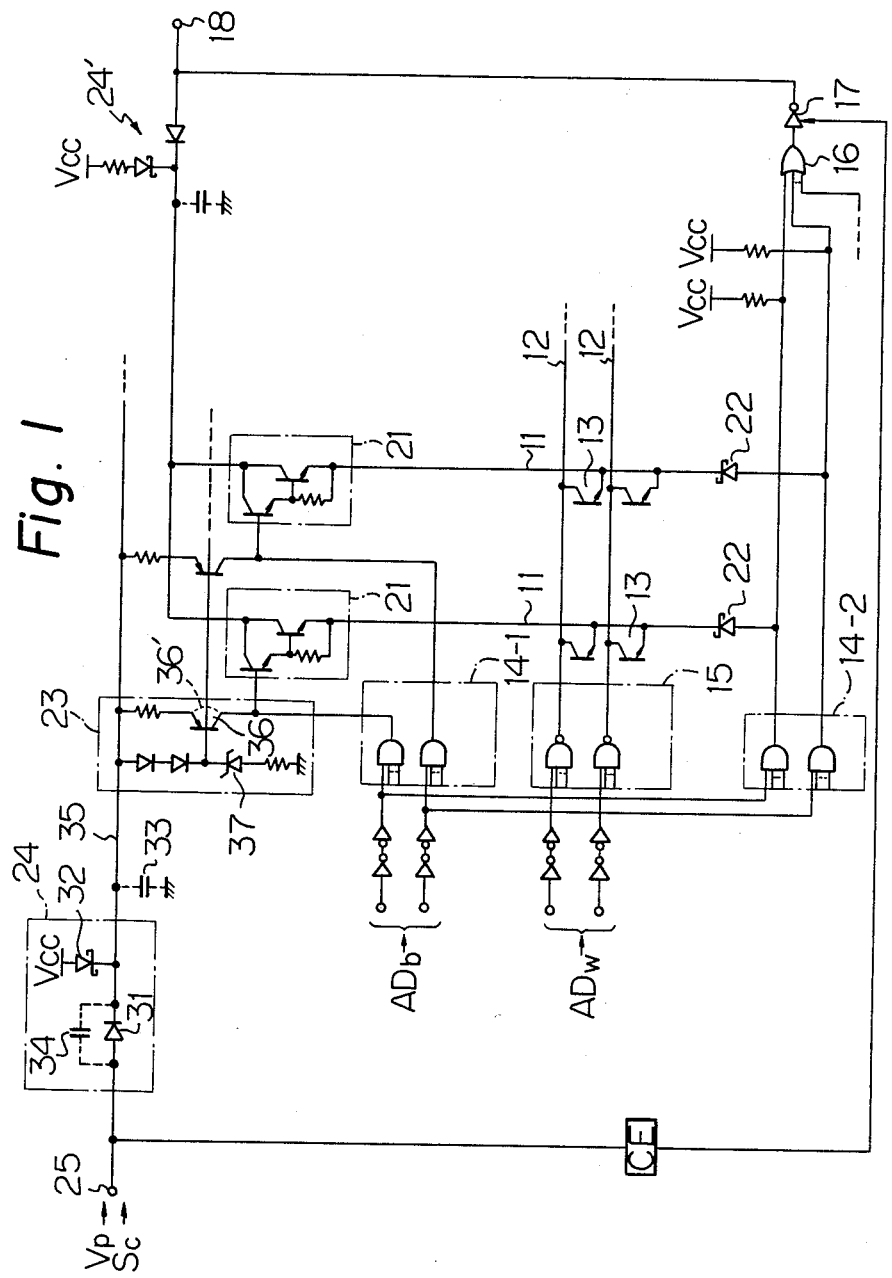
FIG. 1 is a circuit diagram of a prior art PROM of a junction shorting type and a switching circuit 24 proposed by the inventors.

FIG. 1 is a circuit diagram of a prior art PROM of a junction shorting type and a switching circuit 24 proposed by the inventors. In this figure, reference numerals 11 indicate bit lines, 12 word lines, and 13 memory cells arranged at each cross point of a bit line and a word line. The data of each memory cell 13 is not erasable once a write operation is achieved therein. The desired memory cell 13 is selected by selecting the corresponding bit line 11 by means of a bit decoder 14-2 and selecting the corresponding word line 12 by means of a word decoder 15. To these bit and word decoders, bit address $AD_b$ and word address $AD_w$ are applied, respectively. The bit decoder 14-2 is used for a data reading operation. The read data for the corresponding bit line is produced, via an OR gate 16 and an output buffer 17, from an input/output terminal 18.

The above operation is performed under a read mode and energized by a power source having a voltage of $V_{cc}$. On the other hand, a write mode is performed as follows. One of program circuits 21 to which the data is to be written is selected by a bit decoder 14-1 in accordance with the bit address $AD_b$. Then, a program current of about 120 mA is supplied, via a switching circuit 24', from the input/output terminal 18 to the thus selected program circuit 21 and further to the corresponding bit line 11. In this case, a Schottky barrier diode 22 is inserted in each bit line 11 so as to prevent any deleterious effect by the program current to the circuit for achieving the read operation.

The program circuit 21 is formed as a Darlington circuit so that the program current of 120 mA can flow therethrough. In this case, since a base current must be supplied to a first stage transistor of the transistors comprising the Darlington circuit, a so-called constant current source 23 is employed therefor. The constant current source 23 is made active only during the write operation mode. That is, the source 23 is not activated until the program control voltage $V_p$ of about 20 V is applied to a control terminal 25. In this case, the source 23 must be electrically effective as viewed from the control terminal 25 under the write operation mode only, while it must not be electrically effective as viewed therefrom under any mode other than the write operation mode. For this, a switching circuit is required. The inventors have attempted to employ a circuit 24 as that switching circuit. The switching circuit 24 at the side of the control terminal 25 has a similar construction to the switching circuit 24' at the side of the input/output terminal 18. The switching circuit 24' has already been known, for example, as recited in a catalog by INTERSIL, INC as "IM56SXX SERIES". It should be noted that the function to be performed by the switching circuit 24 is quite different from that of the switching circuit 24'.

As previously mentioned, the control terminal 25 is a common terminal for selectively receiving the program control voltage $V_p$ under the write operation mode or the input control signal $S_c$ under the read operation mode. It should be understood that the input control signal $S_c$ is used for example, as a signal to activate the output buffer 17 via a chip enable circuit CE, during the read operation mode. However, the signal $S_c$ is not limited to this type of signal, but can be used for other purposes.

Thus, the program control voltage $V_p$ or the input control signal $S_c$ is selectively applied to the control terminal 25. In this case, the constant current source 23 and the related circuits cannot be electrically effective as viewed from the input control signal $S_c$; instead the constant current source 23 is electrically effective as viewed from the control terminal 25 only when the program voltage $V_p$ is applied thereto. This is made possible by means of the switching circuit 24. The circuit 24 is comprised of a diode 31 and a Schottky barrier diode 32. The diode 31 is fully cut off when a signal having a level lower than $V_{cc}$, such as the input control signal $S_c$, is applied to the terminal 25, because a parasitic capacitor 33, at the cathode side of the diode 31, has charged up to the power source voltage level of $V_{cc}$ through the diode 32. Consequently, only a junction capacitor 34 of the diode 31 is visible for the input control signal $S_c$.

Turning now to the essential point of the prior art shown in FIG. 1, under the read operation mode, a line 35 is charged up to about the $V_{cc}$ level due to the charged parasitic capacitor 33, as previously mentioned. Thus, although a transistor 36 in the constant current source 23 must not be turned on during the read operation mode, the transistor 36 is often unintentionally turned on due to the presence of the $V_{cc}$ level on the line 35. This causes the aforesaid problem of an erroneous operation in the memory, especially in the program circuit 21.

Such an erroneous operation cannot theoretically be induced in the program circuit 21, because the transistor 36 is supposed to be off during the read operation mode, with a Zener voltage of, for example 6 V by a Zener diode 37. However, in actuality, the transistor 36 is often turned on unintentionally during the read operation mode.

Thus, the previously mentioned control circuits to which the present invention is concerned are specifically the program circuits 21, the constant current source 23, and the switching circuit 24. Of these, the circuits 21 and the source 23 are already known, for example, in FIG. 4 of U.S. Pat. 4,319,341. Regarding the constant current source 23, the transistor 36 is preferably formed with a lateral PNP structure. If the transistor 36 is so formed, there is a possibility that the transistor 36 will be unintentionally turned on during the read operation mode.

The reason for this is as follows. In an insulation layer formed on the base region of the lateral PNP transistor 36, impurities (+ion) may originally be included therein or externally injected thereinto after formation of the insulation layer. Such impurities may often change the conduction type at the surface of the base region to a P type, in which it is considered that the impurities of + ion are charged at the upper side of the insulation layer, while the impurities of − ion are charged at the bottom side thereof. Therefore, a P type channel attracted by impurities of − ion is created in the surface of the base region. It should be noted that the lateral PNP transistor 36 is advantageous for simply constructing the constant current source 23.

The formation of such a P type channel makes the transistor 36 seemingly on. The thus formed channel is represented in FIG. 1 by the broken line 36'. This phenomena is usually called "channel leakage".

In order to avoid channel leakage, in the prior art, the insulation layer is covered by an emitter electrode, which insulation layer is formed on the base region. Since the emitter electrode is maintained at the power source voltage level of $V_{cc}$, the − ion impurities are attracted to the upper side of the insulation layer, and, therefore, the + ion impurities are charged at the bottom side thereof. The thus charged + ion impurities change the conduction type of the channel to the N type. As a result, undesired channel leakage can be avoided.

Figure 2A:
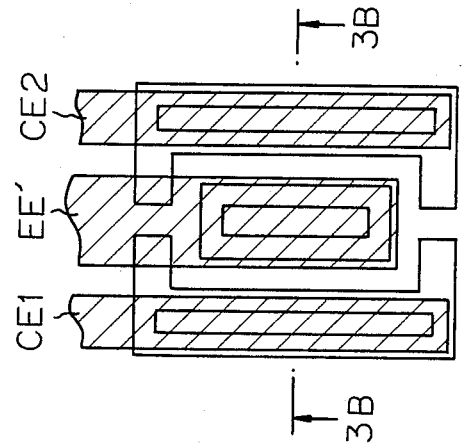
FIG. 2A is a plan view of a lateral PNP transistor with an emitter electrode for avoiding the channel leakage.
Figure 2B:
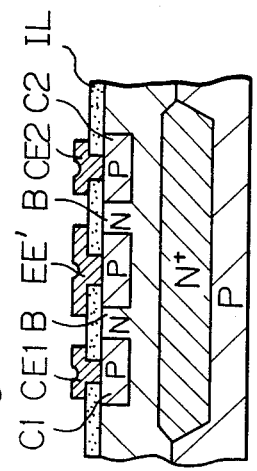
FIG. 2B is a cross-sectional view taken along the line 2B—2B in FIG. 2A.
Figure 3A:
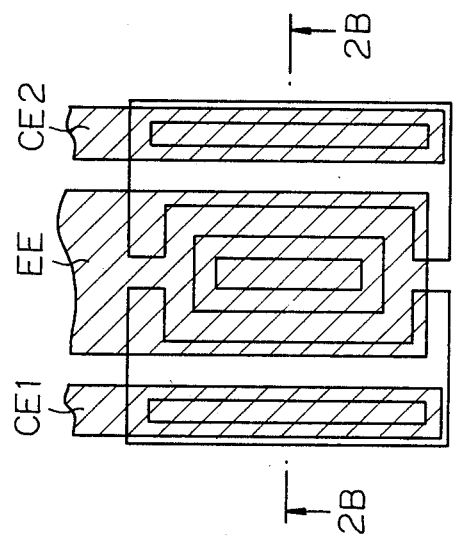
FIG. 3A is a plan view of a lateral PNP transistor with a usual emitter electrode.
Figure 3B:
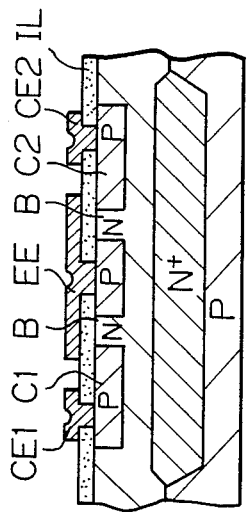
FIG. 3B is a cross-sectional view taken along the line 3B—3B in FIG. 3A.

The prior art way for avoiding channel leakage, however, has a disadvantage. This will be explained with reference to FIGS. 2A to 3B. FIG. 2A is a plan view of a lateral PNP transistor with an emitter electrode for avoiding channel leakage. FIG. 2B is a cross-sectional view taken along the line 2B—2B in FIG. 2A. FIG. 3A is a plan view of a lateral PNP transistor with a usual emitter electrode. FIG. 3B is a cross-sectional view taken along the line 3B—3B in FIG. 3A.

The concerned transistor 36 in FIG. 1 has a plan view and a cross-sectional view shown in FIGS. 2A and 2B, respectively. In FIGS. 2A and 2B, particular attention should be paid to an emitter electrode EE. (In FIGS. 2A and 3A, hatchings are employed to illustrate not cross-sections, as usual, but to distinguish conductive lines and other members.) The electrode EE is wider than a usual emitter electrode EE' of FIGS. 3A and 3B and covers the base region B. Thus, channel leakage can be prevented.

In these figures, reference symbol IL denotes the insulation layer mentioned hereinbefore, C1 a first collector region, C2 a second collector region, CE1 a first collector electrode, and CE2 a second collector electrode.

The disadvantage of the prior art is that, as is clear from FIGS. 2A and 2B, the employment of such a wide emitter electrode EE impedes realization of a highly integrated memory. That is, the collector electrodes CE1 and CE2 of FIGS. 2A and 2B must be positioned far enough from the adjacent emitter electrode EE to prevent electric shorting between these electrodes CE1, CE2 and EE. In this regard, the transistor 36 occupies a considerably large area in the memory.

In any case, to overcome the aforesaid problem, the prior art requires the use of such a large scale transistor 36 which often induces erroneous operation in the program circuits 21. To make matters worse, such a transistor 36 is necessary for each bit line, therefore impeding the degree of integration of the memory.

Figure 4:
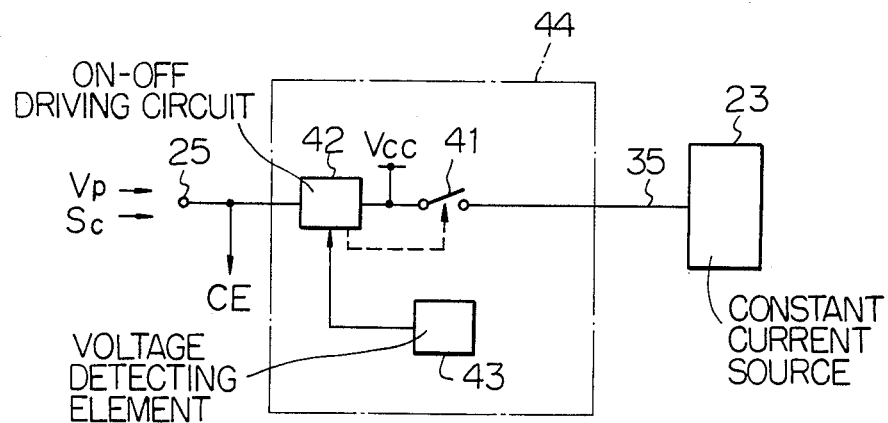
FIG. 4 is a block diagram illustrating the principle of a switching circuit included in the memory according to the present invention.

FIG. 4 is a block diagram illustrating the principle of a switching circuit included in the memory according to the present invention. In FIG. 4, a switching circuit 44 corresponds to the switching circuit 24 shown in FIG. 1. Other members 23, 25, and 35 are identical to the constant current source, control terminal, and line, respectively. The switching circuit 44 includes therein a switching element 41 which receives, at its input side, the power source voltage $V_{cc}$. Accordingly, so long as the switching element 41 is held off, no power source voltage $V_{cc}$ can be applied to the transistor 36 (FIG. 1) in the constant current source 23. This means that, even if the aforesaid channel leakage occurs in the transistor 36, there is no possibility that the base current will be supplied to the first stage transistor of each program circuit 21 (FIG. 1). The on-off driving for the switching element 41 is achieved by an on-off driving circuit 42. The circuit 42 is controlled by a voltage detecting element 43. When a signal to be applied to the control terminal 25 is the usual input control signal $S_c$, the circuit 42 functions to turn off the switching element 41. Contrary to this, when the program control voltage $V_p$ is applied to the control terminal 25, the voltage detecting element 43 detects the applied voltage level of, for example, 20 V. Then, the circuit 42 functions such as to turn on the switching element 41. This makes the constant current source 23 active, so that the program circuit 21 (FIG. 1) which is connected to the selected bit line 11 by the address $AD_b$, is operated.

Figure 5:
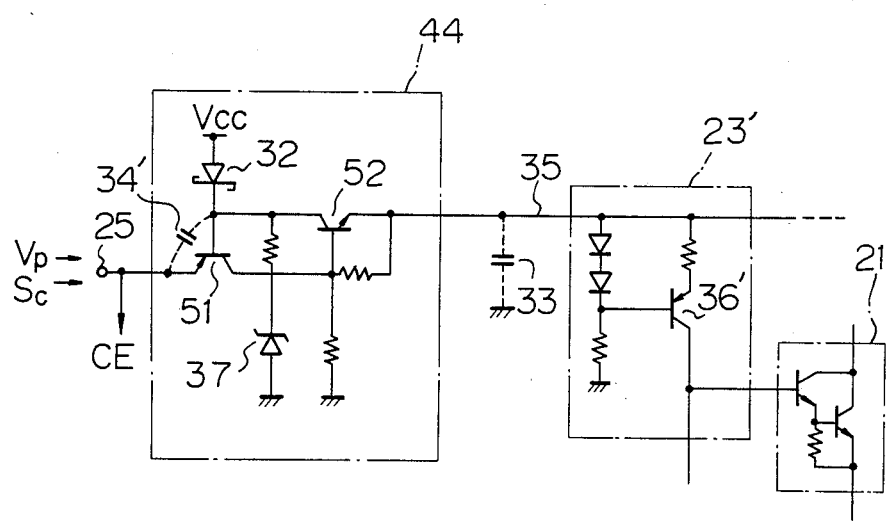
FIG. 5 is a detailed circuit diagram of the switching circuit of FIG. 4 and its neighboring control circuits.

FIG. 5 is a detailed circuit diagram of the switching circuit 44 of FIG. 4 and its neighboring control circuits. In this figure, the switching element 41 of FIG. 4 is formed by, for example an output side transistor 52, as illustrated therein. Thus, the transistor 52 and an input side transistor 51 together with the voltage detecting element are constructed, as a whole, in the form of a thyristor. Here, it should be noted that the thyristor structure is not intentionally formed, but necessarily results from the above-mentioned transistor arrangement. There is no reason for intentionally introducing such a thyristor.

The voltage detecting element 43 (FIG. 4) is made of the Zener diode 37. The Zener diode 37 is not newly employed, but is one removed from the constant current source 23 of FIG. 1, which Zener voltage is, for example 6 V. Thus, no Zener diode similar to that of the constant current source 23 in FIG. 1 is found in the corresponding constant current source 23' in FIG. 5.

It is necessary first to turn on the transistor 51 so as to turn on the transistor pair 51 and 52. Here, the transistor 51 can be turned on if a trigger current flows from the control terminal 25 via the emitter and base of the transistor 51 and the Zener diode 37 to the ground. However, during the read operation mode, the transistor 51 cannot be turned on, and the input control signal $S_c$ is of the voltage $V_{sc}$, which level merely reaches the Zener region of the Zener diode 37. Therefore, the transistor 52 is also still off. Under such circumstances, only a junction capacitor 34' between the emitter and base of the transistor 51 is electrically effective as viewed from the control terminal 25; one end of the capacitor 34' being maintained, via the Schottky barrier diode 32, at the power source voltage level of $V_{cc}$.

Such a circumstance as mentioned just above is equivalent to the circumstance, under the same mode in FIG. 1 where only the junction capacitor 34 of the diode 31 is electrically effective as viewed from the control termnal 25, in which one end of the capacitor 34 is maintained, via the Schottky barrier diode 32, at the power source voltage level of $V_{cc}$.

A similar circumstance is exhibited in the switching circuit 24 (FIG. 1) and the switching circuit 44 (FIGS. 4 and 5), but there is a difference that, with the use of the prior art switching circuit 24, the transistor 36 is often unintentionally turned on due to the aforesaid channel leakage, since the power source voltage $V_{cc}$ is supplied as it is to the constant current source 23 (FIG. 1). However, with the use of the switching circuit 44, the power source voltage $V_{cc}$ is not supplied to the constant current source 23' due to the presence of the transistor 52 now off, in which the line 35 is maintained at the ground level. Thus, the transistor 36' (FIG. 5) cannot erroneously be turned on by the channel leakage.

The input side transistor 51 to be connected to the control terminal 25 is preferably fabricated as a lateral PNP transistor, as is the transistor 36'. Further, the lateral PNP transistor 51 is preferably formed to have the enlarged emitter electrode as shown in FIGS. 2A and 2B so as to prevent channel leakage. It should be noted that the employment of such a lateral PNP transistor 51 having an enlarged emitter electrode does not cause a problem in the integration of the memory. This is because there is only one transistor 51 in the memory. It should be noted that the above mentioned matters do not apply to the transistor 52, because it is an NPN type transistor.

On the other hand, during the write operation mode, the high level program voltage $V_p$ is applied to the control terminal 25. Therefore, the trigger current flows through the emitter and base of the transistor 51 and the diode 37. The transistor 51 is turned on by the trigger current. Soon after this, a base current is supplied to the output side transistor 52 from the transistor 51 now on. Thus, the transistor 52 is also turned on. Once both transistors 51 and 52 are turned on, the on state is held without the aforesaid trigger current. However, the transistors 51 and 52 are turned off when the program voltage $V_p$ stops being applied to the terminal 25. If no program voltage $V_p$ is given, the transistors 51 and 52 are both off.

When the transistor 52 is turned on, the parasitic capacitor 33 is charged up to the power source voltage level of $V_{cc}$. This changes the constant current source 23' to its active state and, therefore, changes the program circuit 21 to its operative state. This makes it possible to supply a program current of about 120 mA to the selected memory cell, and, thus, a data write operation can be achieved therein.

It should be understood from the above explanations that it does not matter if the channel leakage is induced in each transistor 36' because each transistor 36' is guaranteed to be off during the read operation mode. Consequently, it is not necessary to form each transistor 36' as shown in FIGS. 2A and 2B. They can be formed as shown in FIGS. 3A and 3B. This makes it possible to reduce the size of each transistor 36'.

As explained above, the problem of malfunctions in the memory, especially during the read operation mode, can be overcome merely by introducing the transistors 51 and 52 and several resistors into the switching circuit. Also, a highly integrated PROM can be obtained, because each transistor 36' can be reduced in size, as mentioned above, compared with the usual corresponding transistor 36.

We claim:

1. A semiconductor memory device operatively connected to receive a program control voltage and an input control signal, comprising:
   a plurality of bit lines;
   a plurality of word lines intersecting said plurality of bit lines;
   memory cells connected at the intersections of said bit lines and word lines;
   program circuits respectively connected to said bit lines, each of said program circuits being operative to write data to a memory cell when the corresponding one of said bit lines is selected during a write operation;
   a constant current source for supplying a write current to the one of said program circuits corresponding to the selected memory cell;
   a control terminal, operatively connected to said constant current source, for receiving, during the write operation, a program control voltage to be applied to the constant current source, and for receiving the input control signal during operations other than the write operation; and
   a switching circuit, connected between said control terminal and said constant current source, for supplying the program control voltage to said constant current source only during the write operation, said switching circuit including a switching element connected in series between said control terminal and said constant current source, said switching element being turned on when said control terminal recieves a signal having a voltage level which exceeds a predetermined voltage level which is greater than the voltage level of the input control signal but less than the voltage level of the program control voltage, so that the program control voltage is supplied to said constant current source, said switching element being turned off when said control terminal receives a signal having a voltage level lower than the predetermined voltage level, so that a voltage supplied to said constant current source is maintained at a level which is not high enough to operate said program circuits.

2. A semiconductor memory device as set forth in claim 1, wherein said switching element comprises an input side transistor operatively connected to said control terminal, an output side transistor operatively connected to said constant current source, and a Zener diode operatively connected to said input side transistor, wherein said input side and output side transistors are formed as a thyristor cooperating with said Zener diode which is connected to said input side transistor at its base for absorbing a trigger current from said control terminal; the predetermined voltage having a level defined by said Zener diode which has a Zener voltage greater than the voltage level of the input control signal but less than the voltage level of the program control voltage; and wherein said switching circuit further comprises a diode operatively connected to the base of said input side transistor and operatively connected to receive a power source voltage.

3. A semiconductor memory device as set forth in claim 2, wherein said diode clamps the base of said input side transistor at the power source voltage level and comprises a Schottky barrier diode.

4. A semiconductor memory device as set forth in claim 3, wherein each of said memory cells comprises NPN transistors, wherein said memory cells form a programmable read only memory, wherein said constant current source comprises a lateral PNP type transistor, and wherein said input side transistor and said output side transistor comprise a lateral PNP type transistor and an NPN type transistor, respectively.

5. A semiconductor memory devices as set forth in claim 4, wherein said input side transistor of the lateral PNP type has an enlarged emitter electrode which is wide enough to cover its base region, and wherein said lateral PNP type transistor forming said constant current source does not have an enlarged emitter electrode.

6. A semiconductor memory device as set forth in claim 5, wherein the anode of said Zener diode is grounded, further comprising:
   a first resistor operatively connected to the cathode of said Zener diode, the base of said input side transistor and the collector of said output side transistor;
   a second resistor operatively connected to the base and emitter of said output side transistor and operatively connected to the collector of said input side transistor at an intermediate connecting point; and
   a third resistor grounded and operatively connected to the intermediate connecting point of said second resistor, the base of said output side transistor, and the collector of said input side transistor, wherein the emitter of said input side tranisistor is connected to said control terminal, and wherein the emitter of said output side transistor is connected to said constant current source.

7. A semiconductor memory device having a control terminal for receiving a program control voltage and an input control signal, said semiconductor memory device for performing a write operation and comprising:
   a memory cell array including bit lines and word lines;
   program circuits respectively connected to said bit lines of said memory cell array, for writing data into selected memory cells of the memory cell array during the write operation;
   a constant current source for supplying a write current to the one of said program circuits corresponding to a selected memory cell; and
   switching means, operatively connected between the control terminal and said constant current source, for supplying the program control voltage to said constant current source only during the write operation, said switching means including a switching element operatively connected between the control terminal and said constant current source, said switching element being placed in a first switching position when the control terminal receives a signal having a voltage level which exceeds a predetermined voltage level and being placed in a second switching position when the control terminal receives a voltage level lower than the predetermined voltage level, the predetermined voltage level being greater than the voltage level of the input control signal but less than the voltage level of the program control voltage, so that the program control voltage is supplied to said constant current source when said switching element is in the first switching position but the voltage supply to said constant current source is maintained at a level which is not high enough to operate said program circuits when said switching element is in the second switching position.

8. A semiconductor memory device as set forth in claim 7, wherein said switching element comprises a first transistor operatively connected to said constant current source, and wherein said switching means further comprises:
- a second transistor operatively connected to the control terminal and operatively connected to said first transistor at a first node;
- a Zener diode operatively connected to a reference voltage and operatively connected at the first node, said Zener diode having a Zener voltage corresponding to the predetermined voltage level which is greater than the voltage level of the input control signal but less than the voltage level of the program control voltage.

9. A semiconductor memory device as set forth in claim 8, wherein said second transistor has a base connected at the first node, and wherein said switching circuit further comprises a Schottky barrier diode connected to the base of said second transistor at the first node and operatively connected to receive a power source voltage, so that said diode clamps the base of said second transistor at the power source voltage level.

10. A semiconductor memory device as set forth in claim 8, wherein each of the memory cells comprises NPN transistors, wherein said memory cells form a programmable read-only memory, wherein said constant current source comprises a lateral PNP type transistor, and wherein said first transistor and said second transistor comprise an NPN type transistor and a lateral PNP type transistor, respectively.

11. A semiconductor memory device as set forth in claim 10, wherein said switching circuit further comprises:
- a first resistor operatively connected between said Zener diode and the first node;
- a second resistor having a first terminal connected to the emitter of said first transistor and to said constant current source, and having a second terminal connected to the base of said first transistor and the collector of said second transistor at a second node; and
- a third resistor operatively connected between a reference voltage and said second node.

* * * * *